United States Patent
Zavracky et al.

(12) 
(10) Patent No.: US 6,261,494 B1
(45) Date of Patent: Jul. 17, 2001

(54) METHOD OF FORMING PLASTICALLY DEFORMABLE MICROSTRUCTURES

(75) Inventors: Paul M. Zavracky, Norwood; Rick H. Morrison, Tauton, both of MA (US); Keith Warner, Warwick, RI (US); Nicol E. McGruer, Dover, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 09/176,789

(22) Filed: Oct. 22, 1998

(51) Int. Cl.⁷ .................................................. C04B 35/00
(52) U.S. Cl. ........................... 264/104; 205/50; 205/70; 205/122; 257/522; 257/735; 257/773
(58) Field of Search .......................... 430/8; 257/522, 257/618, 735, 773, 228, 901, 921; 205/50, 70, 122, 72; 264/104

(56) References Cited

U.S. PATENT DOCUMENTS

| | | | |
|---|---|---|---|
| 5,439,535 | * 8/1995 | Snagovski et al. | 148/544 |
| 5,529,681 | * 6/1996 | Reinecke et al. | 205/70 |
| 5,716,741 | * 2/1998 | Reinecke et al. | 430/8 |
| 5,726,480 | * 3/1998 | Pister | 257/415 |

* cited by examiner

*Primary Examiner*—Merrick Dixon
(74) *Attorney, Agent, or Firm*—Weingarten, Schurgin, Gagnebin & Hayes LLP

(57) ABSTRACT

A method of creating plastically deformed devices which have a three dimensional aspect. Micromechanical structures are created from a material which is plastically deformable and then a section of the structure is bent to an out-of-plane position and can be maintained there without being supported by other mechanical devices such as latches or hinges. The bending of the structures may be done mechanically, by electrostatic forces or by magnetic forces. The bending can also be done in a batch mode where a plurality of devices are bent at the same time as part of the same process. Fuses can be utilized to allow only a predetermined number of devices to be bent in batch mode. The fuses are later blown, thereby providing a plurality of devices which are relatively parallel to the substrate as well as a plurality of devices which are generally out-of-plane with respect to the substrate.

14 Claims, 2 Drawing Sheets

METHOD OF FORMING PLASTICALLY DEFORMABLE MICROSTRUCTURES

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

Surface micromachining has become a popular method for fabricating micromechanical sensors and actuators. In the most commonly used method of forming micromechanical devices, polysilicon is used as the mechanical material. The process involves starting with a substrate. A layer of sacrificial material is deposited on the substrate. A via or other void is provided in the sacrificial layer. The mechanical material, typically polysilicon, is deposited and patterned to form the micromechanical structure. The sacrificial layer is then removed, leaving the micromechanical structure attached to the substrate and having a portion suspended over the substrate. All the structures formed in this manner tend to be generally parallel with the substrate. The distance the suspended part of the structure is disposed above the substrate is typically 2 microns, which limits the degree of movement of the suspended microstructure before it contacts the substrate.

A drawback associated with typical micromechanical devices is that suspended structures are limited to a gap of only a few microns between the suspended portion of the structure and the substrate. As such, the movement of the suspended structure relative to the substrate is severely limited.

Referring now to FIG. 1, a typical micromechanical device formation process is shown. Initially, a layer of sacrificial material 20 is deposited on a substrate 10. At the next step a via 30 is produced in the sacrificial layer. At the next step a layer of material, typically polysilicon, is deposited, forming the micromechanical structure 40. At the next step the micromechanical structure 40 is released by removal of the sacrificial layer 20. As can be seen, the micromechanical structure 40 is only movable a small distance (typically 2 microns) before it contacts the substrate.

A technique has been developed which attempts to overcome the problem of limited movement of the suspended micromechanical structure by utilizing hinges which rotate the structure further away from the substrate after the micromechanical structure is formed. Additionally, mechanical latching has been used to support the micromechanical structures once formed. These devices have proven to be very difficult to manufacture, especially in large quantities. It would be desirable to be able to manufacture a micromechanical structure having a more pronounced three dimensional aspect and a concomitant larger degree of movement with respect to the substrate.

BRIEF SUMMARY OF THE INVENTION

A method of creating plastically deformed devices which have a three dimensional aspect. Micromechanical structures are created from a material which is plastically deformable and then a section of the micromechanical structure is bent to an out-of-plane position and can be maintained there without being supported by other mechanical devices such as latches or hinges. The bending of the structures may be done mechanically, by electrostatic forces or by magnetic forces. The bending can also be done in a batch mode where a plurality of devices are bent at the same time as part of the same process. Fuses can be utilized to allow only a predetermined number of devices to be bent in batch mode. The fuses are later blown or otherwise removed, thereby providing a plurality of devices which include suspended portions that are generally parallel to the substrate as well as a plurality of devices having suspended portions which are generally out-of-plane with respect to the substrate.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

A process for manufacturing plastically deformable microelectromechanical structures (MEMS) is presented. The process provides for producing three-dimensional micromechanical structures which have a large degree of movement. The present invention provides a method of producing micromechanical structures which can be easily and accurately plastically deformed to provide larger degrees of movement for the suspended structure.

In the present process, the micromechanical structure is formed of a plastically deformable material such as nickel. By using nickel, the micromechanical structure can be bent to an angle which exceeds the typical distance achievable with polysilicon structures. Polysilicon structures cannot be bent since polysilicon will fracture before plastically deforming. Utilization of nickel or other plastically deformable material to provide the micromechanical structure allows the structure to be deformed out-of-plane with the substrate and maintained there without the use of hinges, latches or other supporting structures.

Figure 1:
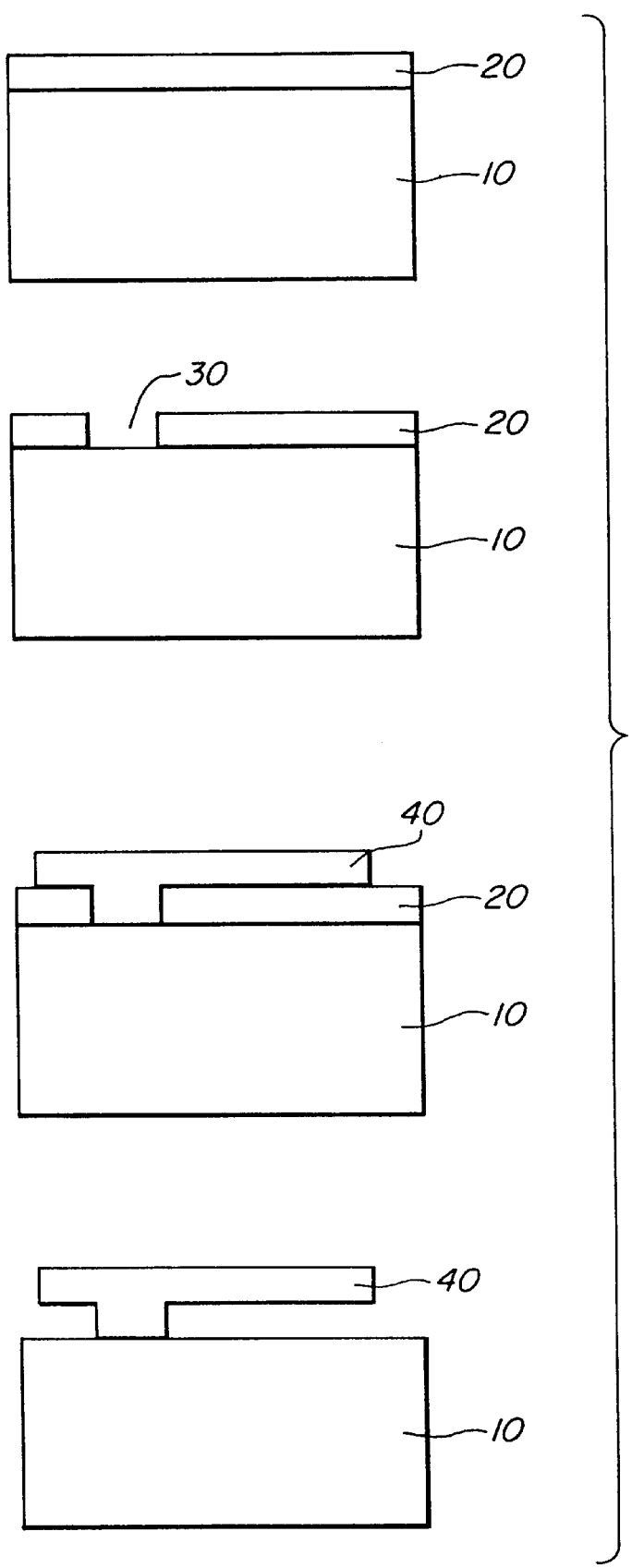
FIG. 1 is a diagram of the formation of a prior art micromechanical device.
Figure 2:
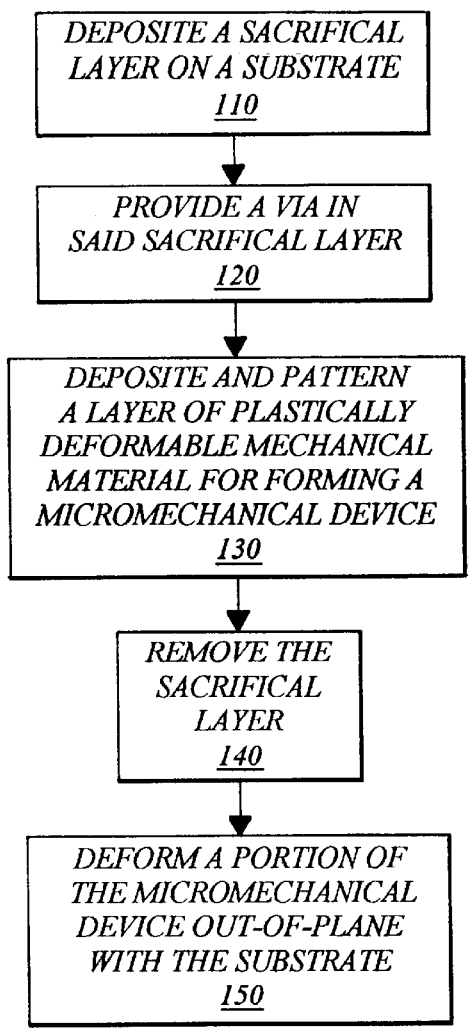
FIG. 2 is a flow chart of the process of the present invention.

Referring now to FIG. 2, a simplified flow chart of the process 100 for producing the plastically deformable micromechanical structure is shown. At step 100 a sacrificial layer is deposited and patterned on the substrate. This sacrificial layer can be an organic material such as photoresist, other material such as polysilicon, or a metal such as aluminum, chrome, copper or nickel. Typical spacing of this sacrificial layer is in the range of approximately 0.01 to 10 micrometers, and preferably approximately 1 micrometer.

At step 120 a via is produced in the sacrificial layer. The via may be produced by using a commercial wet etchant or by other techniques such as plasma etching, sputter etching, and reactive ion etching.

At step a layer of plastically deformable material is deposited and patterned on the substrate, thereby forming the micromechanical structure. The plastically deformable material may be nickel, gold, chrome, aluminum or other plastically deformable material. The plastically deformable material may be deposited by electroless plating, electroplating or other technique which may be patterned by liftoff or chemical etching. A gap of approximately one micron exists between the substrate and the plastically deformable structure.

At step 140 the sacrificial layer is removed, releasing the micromechanical structure. It is also possible to partially remove the sacrificial layer, thus holding portions of the mechanical structure down while forcing other portions to be plastically deformed. This therefore allows only a portion of a beam or similar mechanical structure to be bent. A second sacrificial etch frees the remaining in-plane structure such that no fuses are required. The removal of the sacrificial layer may be performed by etching or dissolving chemically to yield the final structure. Etchants may include water, hydrogen peroxide, ammonium hydroxide, or other compound that is capable of dissolving the chosen sacrificial layer. Preferably the etchant is chosen to dissolve the sacrificial layer and not the plastically deformable structure.

At the last step 150, a portion of the micromechanical structure is deformed such that it is out-of-plane with the substrate. The deformation maybe done mechanically or electrostatically, and may be formed on a plurality of devices at once or on one device at a time.

Figure 3:
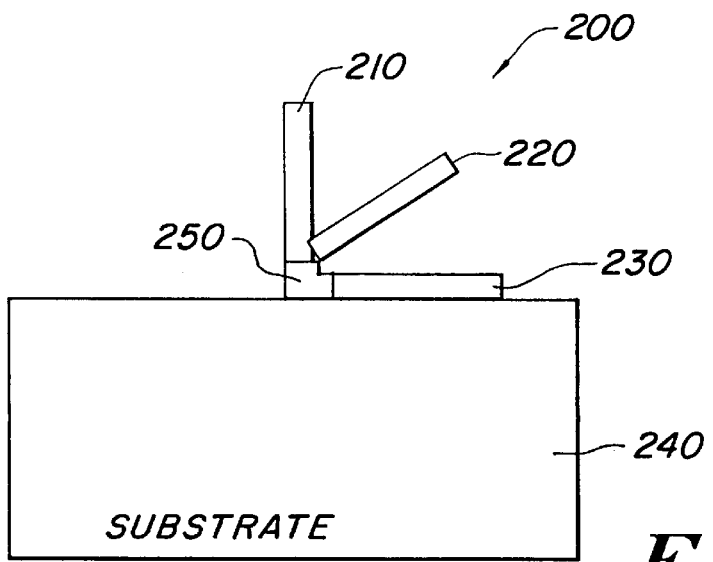
FIG. 3 is a diagram of a device according to the present invention.

As an example of a micromechanical structure formed using the present process, FIG. 3 shows a mirror device 200 which can be activated electrostatically. The mirror device 200 was formed using the process described above. The mirror 210 was formed and rotated such that it is generally normal to the substrate and a first actuation electrode 230. Fixedly attached to the mirror 210 is a second actuation electrode 220. The mirror is movably attached to the substrate with a mechanical flexure 250. When a voltage is applied across the actuation electrodes 220, 230 an electrostatic force is produced which will cause the mirror to deflect toward the substrate. The amount of deflection is dependent upon the strength of the electrostatic field developed across the actuation electrodes 220, 230 as defined by the formula:

$$F = \epsilon A \frac{V^2}{d_1 d_2}$$

where:
F=force of the electrostatic field,
$\epsilon$=permittivity of free space,
A =area of the electrode,
V=applied voltage,
$d_1$=the smallest distance between the electrodes,
$d_2$=the larger distance between the electrodes.

When the mirror is in its typical location, the mirror reflects light to a first position. When an electrostatic force is provided across the electrodes, the mirror is rotated from its typical location such that light reflected by the mirror is reflected to a different location, the different location dependent upon the strength of the field across the electrodes. A device including a plurality of deflectable mirrors may find use in photocopiers, optical scanners, imaging systems, printers and the like.

The micromechanical structure can be plastically deformed in a number of ways, such as by manually bending the device with a probe or other implement. In a production environment it may be more beneficial to use electrostatic forces to plastically deform the device to the desired position. In this manner several plastically deformed micromechanical devices can be produced at once and with a high degree of repeatability and precision.

In some applications it will be desirable to produce a batch of plastically deformable micromechanical devices wherein only a predetermined number of the devices are plastically deformed to be out-of-plane with respect to the substrate, while other devices are not plastically deformed and thus remain generally parallel to the substrate. An example of such a device utilizing both the rotated out-of-plane devices and the in-plane devices would be a micro-optical device wherein two sets of mirrors are provided, wherein the first set is rotatable about a first axis, and the second set rotatable about a second axis which is out of plane with respect to the first axis. In such a manner a raster scanning device is provided.

One manner of producing devices wherein some of the devices are plastically deformed out-of-plane and other devices are not plastically deformed out-of-plane is to utilizes fuses. A fuse in this instance refers to a metallic membrane which ties the micromechanical structure to the substrate or other support. The fuse prevents the micromechanical structure from being plastically deformed. After the deforming process has taken place, the fuses are blown or otherwise removed, thereby freeing the micromechanical structure. A second manner of producing devices wherein some of the devices are plastically deformed out-of-plane and other devices are not plastically deformed out-of-plane is to utilize one two or more sacrificial etching steps. A first sacrificial etching releases some of the micromechanical devices. After the deforming process has taken place, a second sacrificial etching takes place thereby freeing the micromechanical structure. Accordingly, a device is provided in which a number of structures are suspended generally planar to the substrate and a number of structures are generally out-of-plane with respect to the substrate.

Having described preferred embodiments, it will now become obvious to those of ordinary skill in the art that other embodiments may be used. Accordingly, it is submitted that the invention should not be limited to the described embodiment but rather should be limited only by the spirit and scope of the appended claims.

We claim:
1. A process for making a plastically deformable microstructure comprising the steps of:
providing a substrate;
producing a plastically deformable micromechanical device on said substrate, said plastically deformable micromechanical device including a portion disposed on said substrate and a portion spaced apart from said substrate and generally parallel to said substrate; and
plastically deforming the portion of the micromechanical device spaced apart from said substrate such that the spaced apart portion is no longer parallel with said substrate.
2. The method of claim 1 wherein the step of plastically deforming the portion of the micromechanical device is performed mechanically.
3. The method of claim 1 wherein the step of plastically deforming the portion the micromechanical device is performed electrostatically.
4. The method of claim 1 wherein the step of plastically deforming the portion the micromechanical device is performed magnetically.
5. The method of claim 1 wherein said step of producing a plastically deformable micromechanical device includes forming the device from nickel.
6. The method of claim 1 further including the step of providing a fuse between the spaced apart portion of the micromechanical device and said substrate, said fuse pre- venting the deformation of the spaced apart portion of the micromechanical device, after which said fuse is removed.

7. The method of claim 1 wherein the step of producing a plastically deformable micromechanical device comprises the steps of:
   depositing and patterning a sacrificial layer on said substrate;
   selectively etching said sacrificial layer;
   depositing and patterning a layer of plastically deformable material over said sacrificial layer and said substrate; and
   removing said sacrificial layer.

8. The method of claim 1 wherein the step of producing a plastically deformable micromechanical device comprises the steps of:
   depositing and patterning a sacrificial layer on said substrate;
   selectively etching said sacrificial layer;
   depositing and patterning a layer of plastically deformable material over said sacrificial layer and said substrate;
   removing a first portion of said sacrificial layer;
   deforming a portion of said device;
   removing a second portion of said sacrificial layer; and
   deforming a second portion of said device.

9. A process for making a plastically deformable micromechanical structure comprising the steps of:
   providing a substrate;
   producing a plurality of plastically deformable micromechanical device on said substrate, each of said plurality of said plastically deformable micromechanical device including a portion disposed on said substrate and a portion spaced apart from said substrate and generally parallel to said substrate;
   providing a fuse for each of a first group of said plurality of plastically deformable micromechanical devices, each of the first group of micromechanical devices having said fuse connected between the suspended portion of said micromechanical device and said substrate, said fuse preventing the suspended portion of said micromechanical device from begin deformed;
   plastically deforming the portion of the micromechanical device spaced apart portion is no longer parallel with said substrate; and
   removing said fuse on the micromechanical devices of the first group, wherein the first group of said plurality of micromechanical devices are generally planar with respect to said substrate and wherein the remainder of said plurality of micromechanical devices are deformed out-of-plane with respect to said substrate.

10. The method of claim 9 wherein said step of removing said fuse comprises blowing said fuse.

11. The method of claim 9 wherein said step of removing said fuse comprises etching said fuse.

12. The process of claim 1 wherein said step of producing a plastically deformable micromechanical device comprises producing a plastically deformable micromechanical mirror.

13. The process of claim 7 wherein said step of producing a plurality of plastically deformable micromechanical devices comprises producing a plurality of plastically deformable micromechanical mirrors.

14. The process of claim 1 further comprising the step of providing a first electrode attached to said plastically deformable micromechanical device and providing a second electrode on said substrate, such that said spaced apart portion of said micromechanical device is moveable between a first position and a second position as a result of an electrostatic field developed between said first electrode and said second electrode.

* * * * *

UNITED STATES PATENT AND TRADEMARK OFFICE
CERTIFICATE OF CORRECTION

PATENT NO.   : 6,261,494 B1
DATED        : July 17, 2001
INVENTOR(S)  : Paul M. Zavracky et al.

It is certified that error appears in the above-identified patent and that said Letters Patent is hereby corrected as shown below:

Column 2,
Line 50, "step 100" should read -- step 110 --;
Line 61, "step a" should read -- step 130 a --; and Column 6,
Line 7, "plastically deforming the portion of
the micromechanical device space apart portion is no longer parallel
with said substrate; and" should read
-- plastically deforming the portion of the micromechanical device
spaced apart from said substrate which are not part of said first
group, such that the spaced apart portion is no longer parallel with
said substrate; and --.

Signed and Sealed this

Twenty-fourth Day of September, 2002

*Attest:*

*Attesting Officer*

JAMES E. ROGAN
*Director of the United States Patent and Trademark Office*